United States Patent [19]

Baetke

[11] 4,346,352

[45] Aug. 24, 1982

[54] LINEAR AND LOGARITHMIC SWEEP CONTROL CIRCUITS FOR A VOLTAGE-CONTROLLED OSCILLATOR

[75] Inventor: Robert E. Baetke, Aloha, Oreg.

[73] Assignee: Tektronix, Inc., Beaverton, Oreg.

[21] Appl. No.: 192,279

[22] Filed: Sep. 30, 1980

[51] Int. Cl.$^3$ .............................................. H03C 23/00
[52] U.S. Cl. .................................... 331/178; 307/228; 328/185
[58] Field of Search ..................... 331/178, 4; 307/228; 328/181, 185; 324/57 SS, 77 CS; 455/161, 164, 165, 167–169

[56] References Cited

U.S. PATENT DOCUMENTS 3,120,647  2/1964  Bravenec ......................... 331/178 X
3,521,082  7/1970  Wolk ............................... 307/228 X Primary Examiner—Siegfried H. Grimm
Attorney, Agent, or Firm—George T. Noe

[57] ABSTRACT

A sweep control circuit and method for maintaining a constant swept frequency range of a voltage-controlled oscillator when switching between linear and non-linear sweeping functions is provided. The sweep control circuit includes a linear amplifier and an antilogarithmic amplifier, each of which has an output voltage window that is matched to the linear dynamic range of the CVO. Independently selected start and stop voltages are adjustable over the entire linear range of the VCO to set the lower and upper frequency limits as desired for either a linear or a logarithmic sweep. Log converters are utilized to map the linear start and stop voltages to logarithmic counterparts so that the VCO frequency does not shift when switching from one function to the other. This permits a single start frequency control and a single stop frequency control to be employed. A ramp voltage, which is appropriately scaled for both the linear and logarithmic functions, is applied to sweep the VCO. While the transfer functions of the log converters and the antilogarithmic amplifier are highly temperature dependent, the topology of the sweep control circuit is such that in calculating the overall transfer function the temperature terms are cancelled.

8 Claims, 2 Drawing Figures

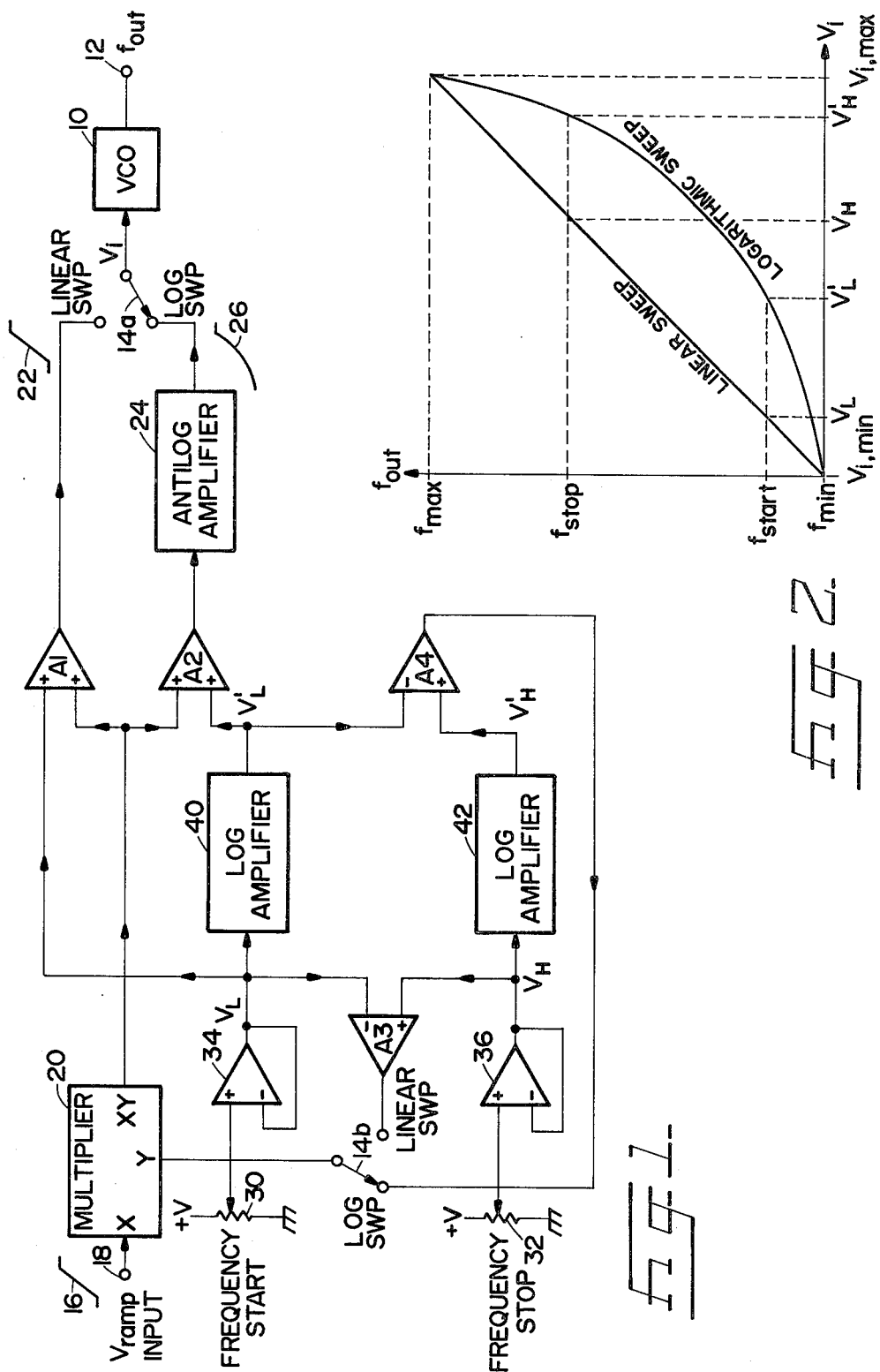

LINEAR AND LOGARITHMIC SWEEP CONTROL CIRCUITS FOR A VOLTAGE-CONTROLLED OSCILLATOR

BACKGROUND OF THE INVENTION

The present invention relates to control circuits for swept voltage-controlled oscillators in general, and in particular to a method and circuit for maintaining a constant output frequency range when switching from a linear to a logarithmic sweep, or from a logarithmic to a linear sweep.

Voltage-controlled oscillators produce a repetitive output signal, the frequency of which is proportional to an input voltage. It is well known to sweep a voltage-controlled oscillator (VCO) either linearly or non-linearly over a range of frequencies. One application of such swept VCO's is in electronic test and measurement apparatus for generating linear or logarithmic frequency sweeps between adjustable start and stop frequencies. A typical sweep control circuit may include both conventional linear and logarithmic amplifiers driven by a common ramp voltage waveform, the start and stop voltages of which may be set independently to thereby establish the start and stop frequencies of the associated VCO. However, when switching from linear to logarithmic sweep, or vice versa, the VCO frequency shifts because of the differing output voltages of the linear and logarithmic amplifiers. As a consequence, it has been necessary to readjust the start and stop frequencies each time a new sweep mode is selected.

SUMMARY OF THE INVENTION

In accordance with the present invention, a sweep control circuit for a voltage-controlled oscillator maintains a constant swept frequency range, including start and stop frequencies which do not shift, when switching from a linear to a logarithmic sweep, or from a logarithmic to a linear sweep. This is achieved by appropriately scaling the control voltage to the VCO for both the linear and logarithmic sweep modes.

The sweep control circuit includes a linear amplifier and an antilogarithmic amplifier, each of which has an output voltage window that is matched to the linear dynamic range of the VCO. Independently selected start and stop voltages are adjustable over the entire linear range of the VCO to set the lower and upper frequency limits as desired for either a linear or a logarithmic sweep. Log converters are utilized to map the linear start and stop voltages to logarithmic counterparts so that the VCO frequency does not shift when switching from one function to the other. This permits a single start frequency control and a single stop frequency control to be employed. A ramp voltage, which is appropriately scaled for both the linear and logarithmic functions, is applied to sweep the VCO. While the transfer functions of the log converters and the antilogarithmic amplifier are highly temperature dependent, the topology of the sweep control circuit is such that in calculating the overall transfer function the temperature terms are cancelled.

It is therefore one object of the present invention to provide a novel sweep control method and circuit for a voltage-controlled oscillator.

It is another object of the present invention to provide a sweep control method and circuit that permits a voltage-controlled oscillator to be swept either linearly or non-linearly over frequency limits which remain constant when switching between the linear and non-linear functions.

It is a further object of the present invention to provide a sweep control method and circuit for sweeping a voltage-controlled oscillator over frequency start and stop limits which are independently adjustable over the entire operating range of the voltage-controlled oscillator.

It is an additional object of the present invention to provide a sweep control method and circuit that permits operation of a voltage-controlled oscillator in either linear or logarithmic sweep modes over adjustable start and stop frequency limits that do not require readjusting when switching between such sweep modes.

It is yet another object of the present invention to provide for a voltage-controlled oscillator a sweep control circuit, the overall transfer function of which is independent of temperature effects.

Additional objects, features, and advantages of the present invention will become apparent as the following description of a preferred embodiment thereof is read in conjunction with the accompanying drawings.

BRIEF DESCRIPTION OF THE DRAWINGS

FIG. 1 is a detailed block diagram of a sweep control circuit for a voltage-controlled oscillator in accordance with the present invention; and FIG. 2 is a diagram of the transfer function of a voltage-controlled oscillator for both linear and logarithmic sweeps.

DETAILED DESCRIPTION OF THE INVENTION

Shown in FIG. 1 is a block diagram of a sweep control circuit for producing a control voltage $V_i$ for a voltage-controlled oscillator (VCO) 10, which may be of any suitable conventional design. VCO 10, in response to the control voltage $V_i$, generates signals over a desired spectrum of frequencies $f_{out}$, which signals are made available at an output terminal 12.

FIG. 2 shows a transfer function of a VCO, and should be considered in conjunction with FIG. 1 to aid in understanding the conceptual basis of the present invention. The control voltage input $V_i$ is plotted on the horizontal axis and the generated signal frequency $f_{out}$ is plotted on the vertical axis. Basically, the VCO has a dynamic range from $V_{i,min}$ to $V_{i,max}$ over which output frequencies $f_{min}$ to $f_{max}$ may be produced. The output range of a VCO is typically specified as a ratio of $f_{max}$ to $f_{min}$, and ratios of 100:1 and 1000:1 are common for log-swept VCO's. One embodiment of the present invention was built and tested in which $f_{min}$ was equal to 20 kilohertz and $f_{max}$ was equal to 2 megahertz, for a 100:1 output range.

The sweep control circuit produces both a linear and a logarithmic sweep, either of which may be selected by a pair of ganged switches 14a and 14b to drive the VCO 10 between preselected and adjustable frequency limits $f_{start}$ and $f_{stop}$. A linear voltage ramp 16 of a predetermined amplitude is applied via an input terminal 18 to a conventional XY multiplier 20. The ramp 16 may be initiated upon command via external circuitry, or it may be repetitive. The scaling factor by which the ramp voltage is multiplied will be discussed below. The multiplied ramp voltage from multiplier 20 is applied simultaneously to one input respectively of a pair of summing amplifiers A1 and A2. As will also be discussed below, start voltages $V_L$ and $V_L$ are generated and applied respectively to summing amplifiers A1 and A2. The output of summing amplifier A1 is a linear ramp voltage 22, which may be applied via switch 14a to VCO 10 as control voltage input $V_i$. The output of summing amplifier A2 is fed to an antilogarithmic amplifier 24, which generates an exponential output 26 from a linear input in the conventional manner. The exponential output 26 may be applied via switch 14a to VCO 10 as control voltage input $V_i$.

The frequency start and stop limits of the VCO output frequency range are determined respectively by potentiometers 30 and 32, the wiper arms of which are connected to the inputs of respective voltage follower amplifiers 34 and 36 to produce independent voltages $V_L$ and $V_H$. Both $V_L$ and $V_H$ are continuously adjustable over the range from $V_{i,min}$ to $V_{i,max}$, and for linear sweep operation, start voltage $V_L$ is applied to one input of amplifier A1 to set the starting point of the sweep at $V_L$ on the $V_i$ scale of FIG. 2. Both voltages $V_L$ and $V_H$ are applied to the inputs of a difference amplifier A3 to produce a difference voltage $V_H$-$V_L$, which may be applied via switch 14b to the Y input of multiplier 20 as the scaling factor by which the linear ramp 16 is multiplied. As a consequence of the scaling by $V_H$-$V_L$, the linear ramp will stop or terminate at $V_H$ on the $V_i$ scale of FIG. 2.

The voltages $V_L$ and $V_H$ may be converted to voltages $V'_L$ and $V'_H$ respectively by logarithmic amplifiers 40 and 42, which suitably may be conventional log converters. The voltage $V'_L$ is applied to one input of summing amplifier A2 to set the starting point of the logarithmic sweep at $V'_L$ on the $V_i$ scale of FIG. 2. Both voltages $V'_L$ and $V'_H$ are applied to the inputs of a difference amplifier A4 to produce a scaling voltage $V'_H$-$V'_L$ to be applied via switch 14b to the Y input of multiplier 20. As a consequence of scaling ramp voltage 16 by $V'_H$-$V'_L$, the exponential output 26 of antilogarithmic amplifier 24 will terminate at $V'_H$ on the $V_i$ scale of FIG. 2.

Therefore, as can be discerned by a perusal of FIG. 2, when switch 14 is switched between the linear and logarithmic functions, the start and stop voltages are shifted along the $V_i$ scale, but the start and stop frequencies remain the same. This is the desired result, and since potentiometers 30 and 32 do not have to be readjusted when switching between linear and logarithmic sweep functions, frequency indicia may be printed directly on the knob assemblies to facilitate quick setting of start and stop frequency limits for the VCO. The VCO 10, antilogarithmic amplifier 24, and logarithmic amplifiers 40 and 42 are mathematically related to ensure precise cooperation. The transfer function of the VCO is shown in FIG. 2 and is $$f_{out} = \frac{f_{max}}{V_{i,max}} V_i \quad (1)$$

The transfer function for the antilogarithmic amplifier is $$V_{out} = \frac{V_{i,max}}{K} e^{\frac{V_2}{V_{i,max}} \ln K}, \quad (2)$$

where $$K = \frac{f_{max}}{f_{min}}$$

and $V_2$ is the output of summing amplifier A2. The transfer function for the logarithmic amplifiers is $$V = \left(\frac{V_{i,max}}{\ln K}\right) \ln \left(K \frac{V}{V_{i,max}}\right), \quad (3)$$

Where $V'$ is $V'_L$ or $V'_H$, $V$ is $V_L$ or $V_H$, and $$K = \frac{f_{max}}{f_{min}}.$$

Equations (2) and (3) above are shown in terms of voltage expressions and therefore are somewhat simplified. Equation (2) may also be expressed as $V_{out} = \alpha e^{(\beta V_2)/(T)}$, and equation (3) may also be expressed as $V' = (T)/(\beta) \ln (V)/(\alpha)$, where for both equations $\alpha$ and $\beta$ are constants set by circuit values and physical constants, and T is absolute temperature in degrees Kelvin. In the logarithmic sweep mode, the overall transfer function of the sweep control circuit is $$V_i = V_L \frac{V_H}{V_L} V_r, \quad (4)$$

where $V_r$ is the peak amplitude of the linear ramp voltage 16. As can be seen, the temperature term T has been cancelled.

What I claim as being novel is:

1. A sweep control circuit for a voltage-controlled oscillator, comprising:
   a linear circuit path and a non-linear circuit path driven by a common ramp voltage to provide respectively a linear sweep signal and a non-linear sweep signal which are selectively connectable to said voltage-controlled oscillator;
   means for generating independent first start and stop voltages;
   means for converting said first start and stop voltages to second start and stop voltages which are related to said first voltages in accordance with a non-linear function determined by said non-linear circuit path; and
   means for combining said first start and stop voltages with said ramp voltage to form said linear sweep signal, and for combining said second start and stop voltages with said ramp voltage to form said non-linear sweep signal.

2. A sweep control circuit in accordance with claim 1 wherein said first start and stop voltage generating means comprises a first potentiometer and a second potentiometer respectively, both of said potentiometers being independently adjustable over a predetermined voltage range.

3. A sweep control circuit in accordance with claim 1 wherein said non-linear circuit path includes an antilogarithmic amplifier for producing said non-linear sweep signal, and wherein start and stop voltage converting means comprises respectively a first and second logarithmic converter.

4. A sweep control circuit in accordance with claim 1 wherein said combining means comprises a summing amplifier disposed in each the linear and non-linear circuit paths to one input of each of which said ramp voltage is applied, said first start voltage being applied to the other input of the summing amplifier in the linear circuit path, and said second start voltage being applied to the other input of the summing amplifier in the non-linear circuit path.

5. A sweep control circuit in accordance with claim 4 wherein said combining means further comprises means for developing first and second scaling voltages from said first and second start and stop voltages, and means for selectively scaling said ramp voltage in accordance with said scaling voltages.

6. A sweep control circuit in accordance with claim 5 wherein said scaling voltage developing means comprises a first and second difference amplifier.

7. A sweep control circuit in accordance with claim 5 wherein said scaling means comprises a multiplier circuit receiving said ramp voltage at one input thereof and selectively receiving one of said first and second scaling voltages at another input thereof.

8. A method of controlling a swept voltage-controlled oscillator so that the output frequency range thereof remains substantially constant when switching between linear and non-linear sweeping functions, comprising the steps of:
  generating independent first start and stop voltages;
  converting said first start and stop voltages to second start and stop voltages in accordance with a non-linear function;
  combining said first start and stop voltages with a linear ramp voltage to provide a linear sweep signal; and
  combining said second start and stop voltages with said linear ramp voltage and then converting the resultant combination to a non-linear sweep signal which is scaled to said linear sweep signal in accordance with said non-linear function.

* * * * *

UNITED STATES PATENT AND TRADEMARK OFFICE
CERTIFICATE OF CORRECTION

PATENT NO. : 4,346,352
DATED : August 24, 1982
INVENTOR(S) : Robert E. Baetke

It is certified that error appears in the above—identified patent and that said Letters Patent is hereby corrected as shown below:

Col. 4, lines 19 and 20 read: $V_{out} = \alpha e(\beta V_2)/(T)$, should read $$V_{out} = \alpha e^{\beta V_2/T}$$

Col. 4, line 21 reads: $V' = (T)/(\beta)\ln(V)/(\alpha)$, should read:

$$V' = \frac{T}{\beta}\ln\frac{V}{\alpha}$$

Signed and Sealed this

Twelfth Day of April 1983

[SEAL]

Attest:

GERALD J. MOSSINGHOFF

Attesting Officer        Commissioner of Patents and Trademarks